United States Patent
Mu et al.

(10) Patent No.: US 8,947,958 B2
(45) Date of Patent: Feb. 3, 2015

(54) LATENT SLOW BIT DETECTION FOR NON-VOLATILE MEMORY

(71) Applicant: Freescale Semiconductor, Inc., Austin, TX (US)

(72) Inventors: Fuchen Mu, Austin, TX (US); Chen He, Austin, TX (US); Peter J. Kuhn, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 241 days.

(21) Appl. No.: 13/647,951

(22) Filed: Oct. 9, 2012

(65) Prior Publication Data

US 2014/0098615 A1 Apr. 10, 2014

(51) Int. Cl.
G11C 16/04 (2006.01)

(52) U.S. Cl.
USPC ...................................... 365/200; 365/185.29

(58) Field of Classification Search
USPC ................................ 365/200, 185.29, 185.22
See application file for complete search history.

(56) References Cited

U.S. PATENT DOCUMENTS

| | | | |
|---|---|---|---|
| 6,967,873 B2 | 11/2005 | Hamilton et al. | |
| 7,180,781 B2 | 2/2007 | Abedifard et al. | |
| 7,558,122 B2 | 7/2009 | Kim et al. | |
| 2003/0021155 A1 | 1/2003 | Yachareni et al. | |
| 2006/0083073 A1 | 4/2006 | Ueda | |
| 2006/0114733 A1* | 6/2006 | Hosono | 365/206 |
| 2011/0242901 A1 | 10/2011 | Marquart | |
| 2013/0279257 A1* | 10/2013 | Costa et al. | 365/185.17 |

FOREIGN PATENT DOCUMENTS

| | | |
|---|---|---|
| WO | 02082447 A2 | 10/2002 |
| WO | 02095762 A2 | 11/2002 |

OTHER PUBLICATIONS

Notice of Allowance mailed May 1, 2014 in U.S. Appl. No. 13/747,504, 12 pages.
U.S. Appl. No. 13/474,504, filed Jan. 23, 2013, entitled Dynamic Detection Method for Latent Slow-to-Erase Bit for High Performance and High Reliability Flash Memory.
U.S. Appl. No. 13/476,711, filed May 21, 2012, entitled "Test Flow to Detect a Latent Leaky Bit of a Non-Volatile Memory".

* cited by examiner

*Primary Examiner* — Vu Le

(57) ABSTRACT

In accordance with at least one embodiment, a non-volatile memory (NVM) and method is disclosed for detecting latent slow erase bits. At least a portion of an array of NVM cells is erased with a reduced erase bias. The reduced erase bias has a reduced level relative to a normal erase bias. A least erased bit (LEB) threshold voltage level of the least erased bit (LEB) is determined. An erase verify is performed at an adjusted erase verify read threshold voltage level. The adjusted erase verify read threshold voltage level is a predetermined amount lower than the LEB read threshold voltage level. A number of failing bits is determined. The failing bits are bits with a threshold voltage above the adjusted erase verify level. The NVM is rejected in response to the number of failing bits being less than a failing bits threshold.

20 Claims, 6 Drawing Sheets

LATENT SLOW BIT DETECTION FOR NON-VOLATILE MEMORY

BACKGROUND

1. Field of the Disclosure

The disclosure relates generally to memories, and more specifically to testing of non-volatile memory devices.

2. Description of the Related Art

Non-volatile memories (NVMs) cells are programmed and erased by applying specific program bias voltages and erase bias voltages, respectively, for which for some types of memories there is generally a limit as to how many times these operations can be performed. Also a common NVM memory type, generally referred to as flash memory, includes many NVM memory cells (a block) that are erased simultaneously. Due to performance variations, for a given set of erase bias voltages, some NVM memory cells of a block will be erased, e.g., placed in an erased state, faster than other NVM memory cells of the block. Thus, because the duration of an erase cycle is selected to erase all cells of an NVM block, those NVM memory cells that are erased more quickly than other memory cells of the same block will continue to be subjected to erase conditions, e.g., application of the erase bias voltages, unnecessarily, while slower NVM memory cells are still being erased. The bits that take longer to erase for a given set of erase bias voltages are referred to as slow bits.

Therefore, faster to erase NVM bits can become over-erased, which can result in memory cells that exhibit undesirable characteristics, such as excessive current leakage. To address such issues, faster to erase memory cells can be soft programmed to overcome the problems associated with over-erase. Soft programming typically takes a relatively long time since it is done per address and with a low program bias. As more cells are required to be soft programmed, the increasing duration of soft programming may eventually cause the embedded erase operation to fail to complete within the specified maximum time. Also, over time, after perhaps tens of thousands of program/erase cycles, some NVM memory cells can become weak or slow to erase. These latent weak memory cells are very difficult to detect until they actually become weak or slow to erase. Thus, it is not uncommon for slow-to-erase memory cells to pass production testing, but become evident well after the device has been placed in an end product. For example, such a slow-to-erase bit can result in the NVM control logic to extending erase time of the entire erase block that includes the now slow bit, which in turn is likely to cause an over-erased distribution of the block's memory cells after the erase operation, hence significantly slowing down the following soft program operation. Eventually such a slow-to-erase bit will cause an embedded erase operation to fail.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION OF THE DRAWINGS

Figure 1:
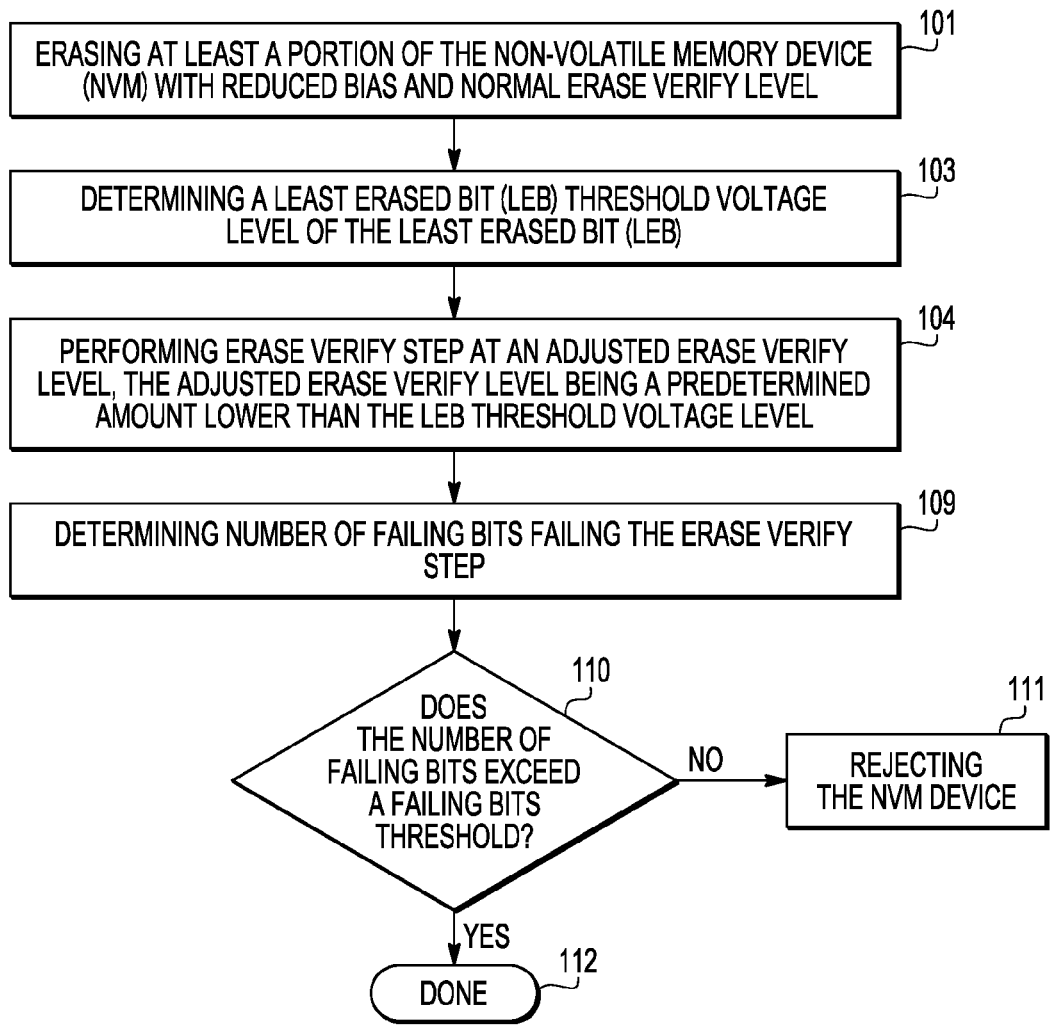
FIG. 1 is a flow diagram illustrating a method in accordance with at least one embodiment.

A particular embodiment of a method and apparatus for detecting non-volatile memory (NVM) bits that are likely to become significantly slower than other NVM bits of a memory over time is provided. Such bits are referred to herein as latent slow bits. One example of such a latent slow bit is a latent slow-to-erase bit, which may, for example, be a bit with abnormally thick oxide, but lower out-of-fab Vt. Such a bit will eventually show up as a slow-to-erase bit during cycling, but typical production test flow would not detect it. The disclosed method and apparatus can be used for latent slow erase bit detection for high performance and high reliability flash memory.

Assuming an erased memory cell has a lower Vt than a programmed memory cell, a latent slow bit of a memory block can be determined by evaluating the location of the least erased bit (LEB) of a memory block within a statistical Vt distribution of the block's other erased bits. It will be appreciated that if the erased memory cell having the highest threshold voltage after erasing all of the memory cells of the block, e.g., the LEB, is located within an acceptable statistical Vt distribution, e.g., in close proximity (in terms of Vt) to other erased bits, the likelihood of the memory block developing a slow-to-erase bit over time is considered low, and test of the memory block is passed. However, if the LEB of a memory block is not located within the acceptable statistical Vt distribution, e.g., not in close proximity (in terms of Vt) to other erased bits, the likelihood of the memory block developing a slow-to-erase bit over time is considered high, and test of the memory block is failed.

Typical memory operations include erasing, programming, and reading. Each of these operations is implemented using a corresponding set of operational criteria that can vary depending upon a mode of operation. For example, the operational criteria of an erase cycle includes a set of erase bias levels and erase timing that is applied to an NVM cell being erased. Similarly, programming an NVM cell is associated with a corresponding set of program bias levels and program timing; and reading an NVM cell is associated with a corresponding set of read bias levels and read timing.

During program/erase cycling in production test flow, an NVM block is repeatedly programmed, erased, and read to verify proper operation. However, such cycling does not typically identify latent errors caused by slow to erase memory cells. Thus, according to an embodiment, one or more particular test cycles are varied (e.g., every 10th or 50th cycle at which the program/erase performance is read and saved). During this varied (readout) test cycle the bits of the NVM block are erased with different erase criteria, e.g., lower erase bias voltages, than that used during the other test cycles. For example, one or more bias voltages applied to the nodes of a memory cell transistor during an erase operation can have a reduced magnitude relative to that of a normal erase operation. TABLE 1 below provides example default bias conditions that can be used for program operations and erase operations for the NVM cells. TABLE 1 also provides example reduced bias voltages that are used to detect latent slow bit. It is noted that other bias conditions in addition to or instead of those indicated below could also be reduced, if desired. For example, the gate node voltage ($V_G$), the drain node bias voltage ($V_D$), the source node bias voltage ($V_S$), the body (substrate) node bias voltage ($V_B$) or any combination thereof could be reduced to help further separate the latent slow bit(s) from the main distribution of bits.

TABLE 1

EXAMPLE DEFAULT BIAS CONDITIONS AND REDUCED BIAS CONDITION FOR PROGRAM/ERASE OPERATIONS

| Operation | $V_D$ (volts) | $V_G$ (volts) | $V_S$ (volts) | $V_B$ (volts) | Reduced Bias Voltage |
|---|---|---|---|---|---|
| Program | 4.2 | 8.5 | GND | GND | 7.5 volts for $V_G$ |
| Erase | float | −8.5 | float | 8.5 | 7.5 volts for $V_B$ |

After the varied test cycle's erase operation finishes, the least erased bit's threshold voltage level (LEB Vt) is found, and an adjusted erase verify operation is performed by setting the erase verify level, e.g., the gate voltage of the bits in the memory block, to a predetermined amount less than LEB Vt, for example by 0.3V. In response to this adjusted erase verify operation determining that the number of resulting non-erased bits is less than or equal to a threshold number, it is determined that the LEB of the block is a statistical outlier, relative to the main Vt distribution profile, which is indicative of the memory block being likely to include a latent slow bit, e.g., a memory cell that becomes a slow-to-erase bit over time; thus the test of the memory has failed and the device including the NVM block is rejected. Alternatively, if in response to the verify operation that uses the lowered erase verify voltage determining that the number of resulting non-erased bits is greater than the threshold number, it is determined the LEB is not a statistical outlier with respect to Vt distribution profile, which is indicative of the memory block being unlikely to produce a slow-to-erase bit over time, and the test of the memory has passed. Note that the threshold number is at least one, to account for the presence of the LEB, and typically less than ten.

The varied test cycle has been discovered to facilitate the detection of intermittent slow-to-erase bits. Such a testing technique is more sensitive than a traditional NVM program/erase screening methods, for which latent slow-to-erase bits remain elusive. In addition, since the LEB Vt will likely vary from device to device, using an adjusted erase verify level, i.e., the LEB Vt found on each device minus a predetermined delta (based on production data) such as 0.3V, will be more effective than a hard-limit test. It will be hard to set the limit in a one-level erase verify check for all devices to neither over-reject (i.e., be too tight) nor under-reject (i.e., be too loose).

While this disclosure primarily refers to erasure of NVM bits, such as erasing, performing erase verify, and finding a latent slow-to-erase bit, it should be understood that a similar test scheme may be used with respect to any state change of memory. For example, in a program test operation, a similar test scheme may be used to screen out units with slow-to-program bits. Various embodiments of the present disclosure will be better understood with reference to FIGS. 1-7.

FIG. 1 is a flow diagram illustrating a method in accordance with at least one embodiment. In block 101, a non-volatile memory (NVM) block is erased with a reduced erase bias and with a normal erase verify bias (normal erase verify level) used to verify erasure, where a reduced erase bias, e.g., a reduced bias voltage, is understood to result in an amount of time needed to erase a bit being longer than the amount of time needed to otherwise erase the bit using the normal (not reduced) erase bias, but to help to better separate the latent slow bit(s) from other bits. An NVM device can contain one or more NVM blocks. In accordance with at least on embodiment, in block 101, the NVM block is erased with a reduced erase bias voltage selected from a group consisting of a reduced gate voltage, a reduced substrate voltage, and/or a reduced drain voltage. After the erase operation passes, all the bits in the NVM block being erased will have threshold voltage lower than the normal erase verify level. From block 101, the method continues to block 103.

In block 103, the least erased bit (LEB) threshold voltage (Vt) level is determined. According to an embodiment, the LEB Vt level may be determined by starting at a high read gate voltage and iteratively reducing the read gate voltage of each memory cell of the memory cells of the block of the NVM until a first bit of one of the memory cells of the block of the NVM changes state. The iteratively reduced read gate voltage may be applied, for example, by a tester or, for example, by changing the operation of a charge pump of a device comprising the NVM block to adjust the gate voltage. From block 103, the method continues to block 104.

In block 104, an adjusted erase verify is performed, where the adjusted erase verify level is a predetermined amount, e.g., in range from 100 to 700 millivolts, lower than the LEB Vt level. In accordance with various embodiments, various values may be used for the predetermined amount. As one example, the performing the adjusted erase verify is performed with the adjusted erase verify level, e.g., the gate voltage, being at least 100 millivolts lower than the LEB threshold voltage level. It will be appreciated, that according to other embodiment the adjusted erase verify level can be reduced from the LEB threshold voltage level by other amounts, such as by at least 200 mV, by at least 200 mV but not more than 400 mV, by at least 200 mV but not more than 500 mV, and the like.

By adjusting the erase verify level to a less potent level (e.g., an adjusted erase verify level that is a predetermined amount lower than the LEB threshold voltage level), the bits at an upper end of a statistical distribution of threshold voltages of bits fail the erase verify operation. If no latent slow erase bit exists, then the bits at the upper end of the statistical distribution of threshold voltages of bits (identified as the bits that fail the erase verify operation using the adjusted erase verify level) will be some portion of the normally functioning bits, and there will be a relatively large number of them since the normally functioning bits will tend to have similar threshold voltages even when the erase verify operation is performed using the adjusted erase verify level. However, if one or more latent slow erase bits exist, their threshold voltages can be expected to be substantially higher than the threshold voltages of normally functioning bits, so, with an appropriate adjusted erase verify level, the bits identified as failing the erase verify operation using the adjusted erase verify level will be the one or more latent slow erase bits, and there will be a relatively small number of them since normally functioning bits can be excluded. Therefore, by determining the number of failing bits failing the erase verify step using the adjusted erase verify level (e.g., at block 109) and comparing the number of failing bits that fail the erase verify operation using the adjusted erase verify level to a failing bits threshold (e.g., at decision block 110), the method of FIG. 1 may be used to identify an NVM device as having latent slow erase bits and to reject such a device (e.g., at block 111) based on the number of failing bits failing the erase verify step using the adjusted erase verify level not exceeding the failing bits threshold, as the existence of at least one slow to erase bit can be expected to result in a relatively small failing bit count that is limited to the relatively small number of slow to erase bits, but the absence of at least one slow to erase bit can be expected to result in a relatively large failing bit count that includes a relatively large number of normally functioning bits. From block 104, the method continues to block 109.

In block 109, the number of bits failing the adjusted erase verify, i.e., bits having Vt above the reduced erase verify level, is determined. In decision block 110, a decision is made as to whether or not the number of failing bits exceeds a failing bits threshold. If the number of failing bits does not exceed the failing bits threshold, the method continues to block 111, where the device comprising the NVM block is rejected as it deemed to have slow-to-erase bit(s). If the number of failing bits does exceed the failing bits threshold, the method continues to block 112, where the device comprising the NVM block passes the test.

Figure 2:
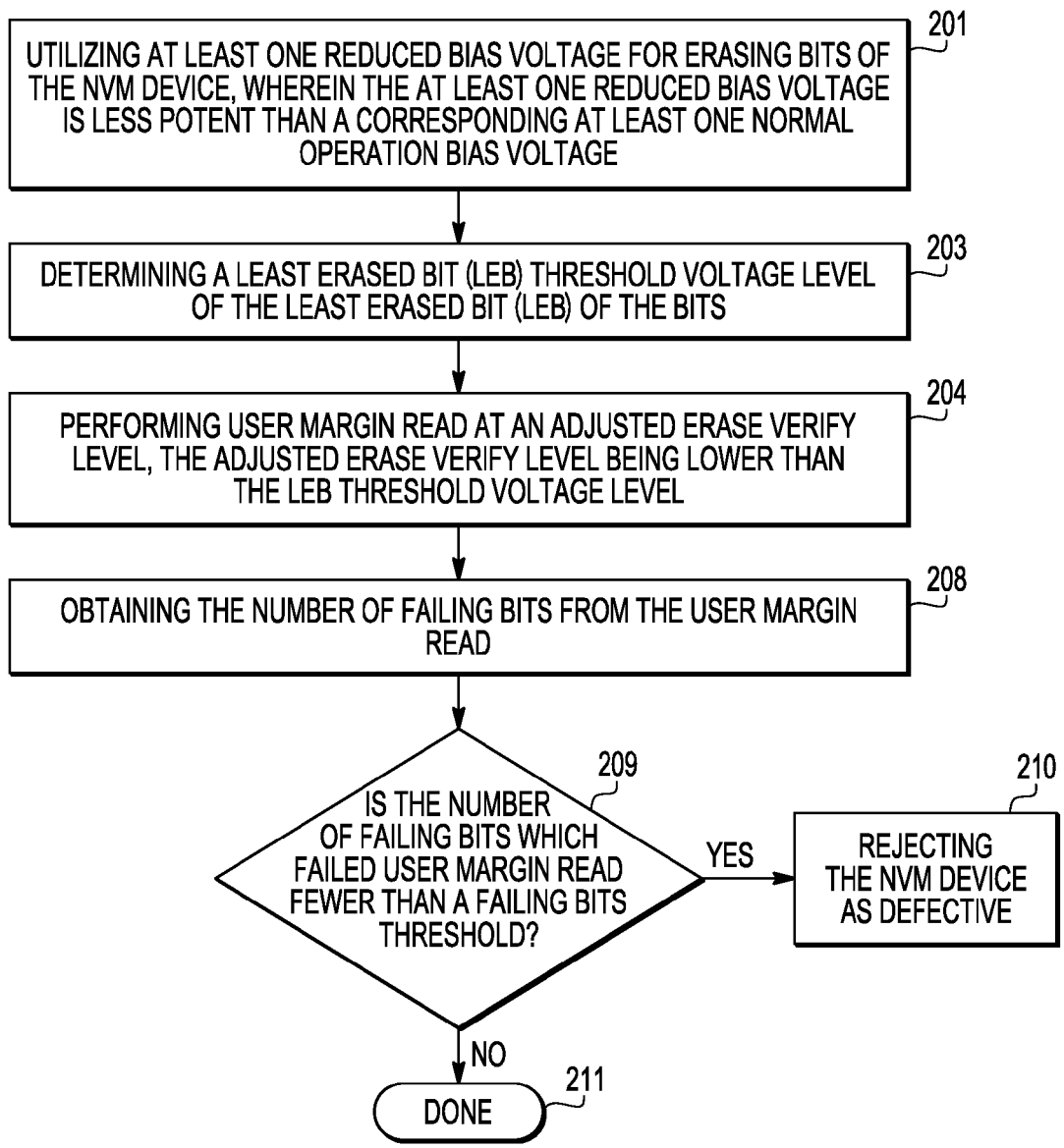
FIG. 2 is a flow diagram illustrating a method in accordance with at least one embodiment.

FIG. 2 is a flow diagram illustrating a method in accordance with at least one embodiment. In block 201, at least one reduced bias voltage is utilized for erasing bits of the NVM block, wherein the at least one reduced bias voltage is less potent than a corresponding at least one normal bias voltage. As used herein, "less potent" should be understood to mean a level that, for each instance of its use in an operation to change the storage state of at least one bit (e.g., an erase operation, a programming operation, etc.), such a "less potent" level exerts less influence to effect such change than a "normal" level used for a corresponding normal operation to change the storage state of the at least one bit (e.g., a normal erase operation, a normal programming operation, etc.). As an example, a "less potent" erase bias voltage may alter the threshold voltages of bits less, for each instance of its use, than a normal erase bias voltage. Accordingly, as an example, it may take more instances of the use of a "less potent" erase bias voltage to alter the threshold voltages of the bits a similar amount as would be altered by relatively fewer instances of use of a normal erase bias voltage. As another example, use of similar numbers of instances of a "less potent" erase bias voltage and a normal erase bias voltage may result in relatively less alteration (e.g., erasing) of the threshold voltages of the bits using the "less potent" erase bias voltage than using the normal erase bias voltage. As another example, a "less potent" program bias voltage may alter the threshold voltages of bits less, for each instance of its use, than a normal program bias voltage. Accordingly, as an example, it may take more instances of the use of a "less potent" program bias voltage to alter the threshold voltages of the bits a similar amount as would be altered by relatively fewer instances of use of a normal program bias voltage. As another example, use of similar numbers of instances of a "less potent" program bias voltage and a normal program bias voltage may result in relatively less alteration (e.g., programming) of the threshold voltages of the bits using the "less potent" program bias voltage than using the normal program bias voltage. Thus, the use of a reduced erase bias voltage for erasing bits of the NVM block results in a longer erase time, but helps to better separate the latent slow bit(s) from other bits. In accordance with at least one embodiment, in block 201, the at least one reduced bias voltage is selected from a group consisting of a reduced gate voltage, a reduced substrate voltage, and a reduced drain voltage. From block 201, the method continues to block 203. In block 203, the threshold voltage (Vt) level of the least erased bit (LEB) of the bits of the bits erased at block 201 is determined. As an example, user margin read operations may be performed by starting at a high read gate voltage and iteratively reducing the read gate voltage of each memory cell of the NVM block until a first bit of one of the memory cells of the NVM block changes state. Accordingly, the threshold voltage (Vt) level of the LEB may be determined to a desired level of resolution. From block 203, the method continues to block 204.

In block 204, a user margin read operation is performed at an adjusted erase verify voltage level, the adjusted erase verify voltage level being lower than the LEB Vt level. In accordance with at least one embodiment, in block 204, the user margin read operation utilizing the adjusted erase verify voltage level is performed wherein the erase verify voltage level is a predetermined amount, in range from 100 mV to 700 mV, lower than the LEB threshold voltage level. The predetermined amount can be a fixed amount or a user programmable amount. A user margin read mode allows software to select reading of memory locations relative to a different read threshold level (e.g., read threshold voltage) than the normal read threshold level at user mode. As a user margin read mode allows software to obtain more information about a bit of a bit cell than merely its binary state, a user margin read mode may be used to implement at least one embodiment described herein at user mode, without the need to use a special factory test mode. From block 204, the method continues to block 208.

In block 208, the number of failing bits from the user margin read operation at the adjusted erase verify level is obtained. From block 208, the method continues to decision block 209. In decision block 209, a decision is made as to whether or not the number of failing bits which failed user margin read at 204 is fewer than a failing bits threshold. If the number of failing bits is fewer than a failing bits threshold, the method continues to block 210, where the device comprising the NVM block is rejected as containing slow-to-erase bit(s). If the number of failing bits is not fewer than a failing bits threshold, the method continues to block 211, where the device comprising the NVM block passes the test.

Figure 3:
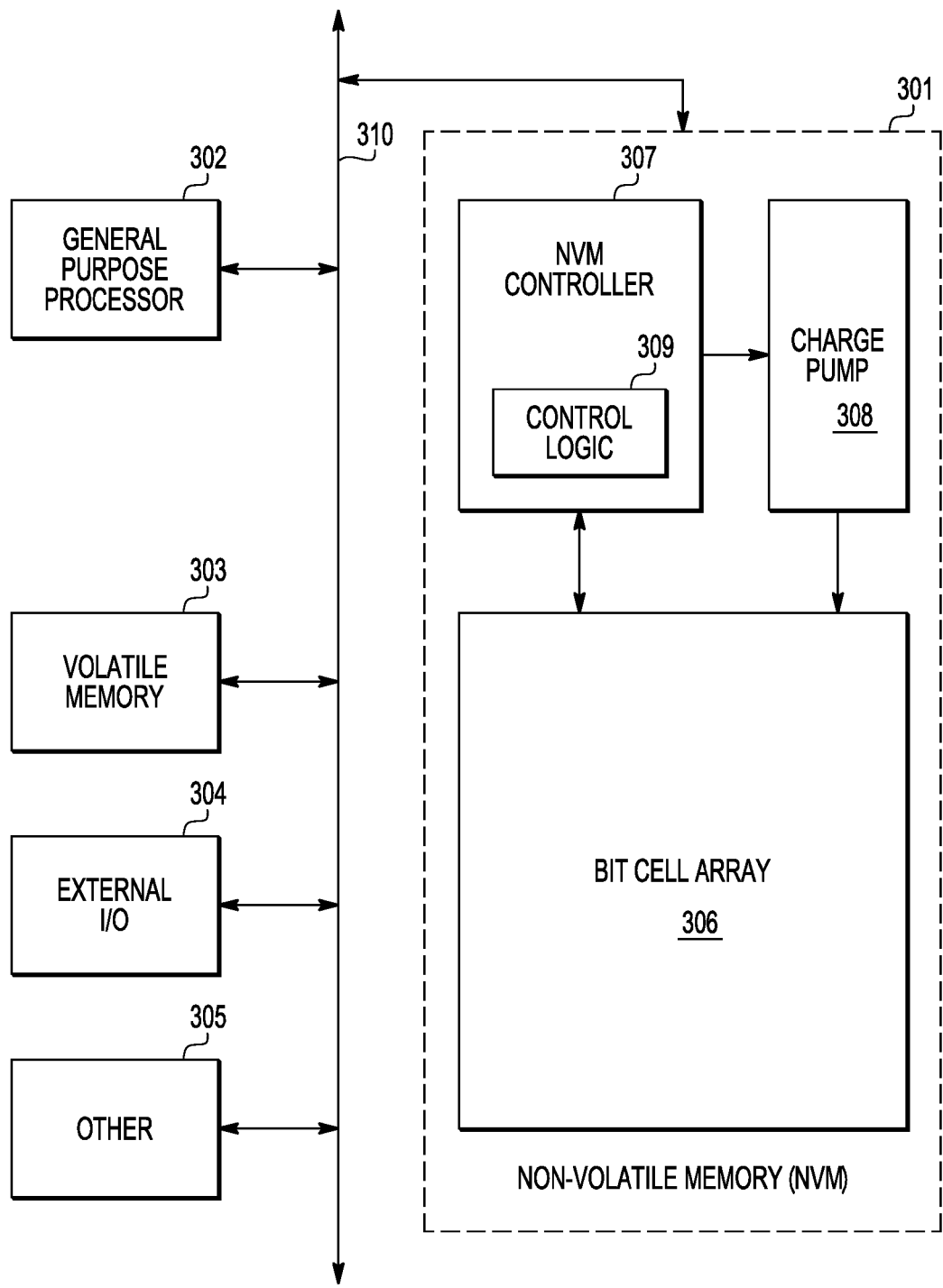
FIG. 3 is a block diagram illustrating apparatus in accordance with at least one embodiment.

FIG. 3 is a block diagram illustrating apparatus in accordance with at least one embodiment. The apparatus comprises non-volatile memory (NVM) 301, general purpose processor 302, volatile memory 303, external input-output (I/O) device 304, and other device 305, each of which may be connected to NVM 301 via a common bus 310 or via separate connections. The apparatus of FIG. 3 can be an integrated circuit die that includes both the NVM 301 and the general purpose processor 302 or NVM 301 may exist as a stand-alone entity. NVM 301 comprises bit cell array 306 which contains one or more blocks of bit cells (i.e., NVM blocks), NVM controller 307, and charge pump 308. NVM controller 307 includes control logic 309 which may be implemented using a finite state machine (FSM), a microprocessor with executable code (e.g., firmware), and the like. The NVM controller 307 is connected to the bit cell array 306 to control operations on the bit cell array, such as reading, writing, and erasing of bits within the bit cell array. The NVM controller 307 is connected to charge pump 308 to control operation of charge pump 308, for example, to control bias levels for program, erase, and read operations, to adjust voltage levels to determine the LEB threshold voltage level, and/or to provide an erase verify level as well as an adjusted erase verify level. The charge pump 308 is connected to bit cell array 306 to provide bias to the bit cell array, for example, to provide bias for program, erase, and read operations, voltages to determine the LEB threshold voltage level. According to an embodiment, the bit cell array includes a plurality of erase blocks, wherein the bits of an individual erase block are erased simultaneously.

Figure 4:
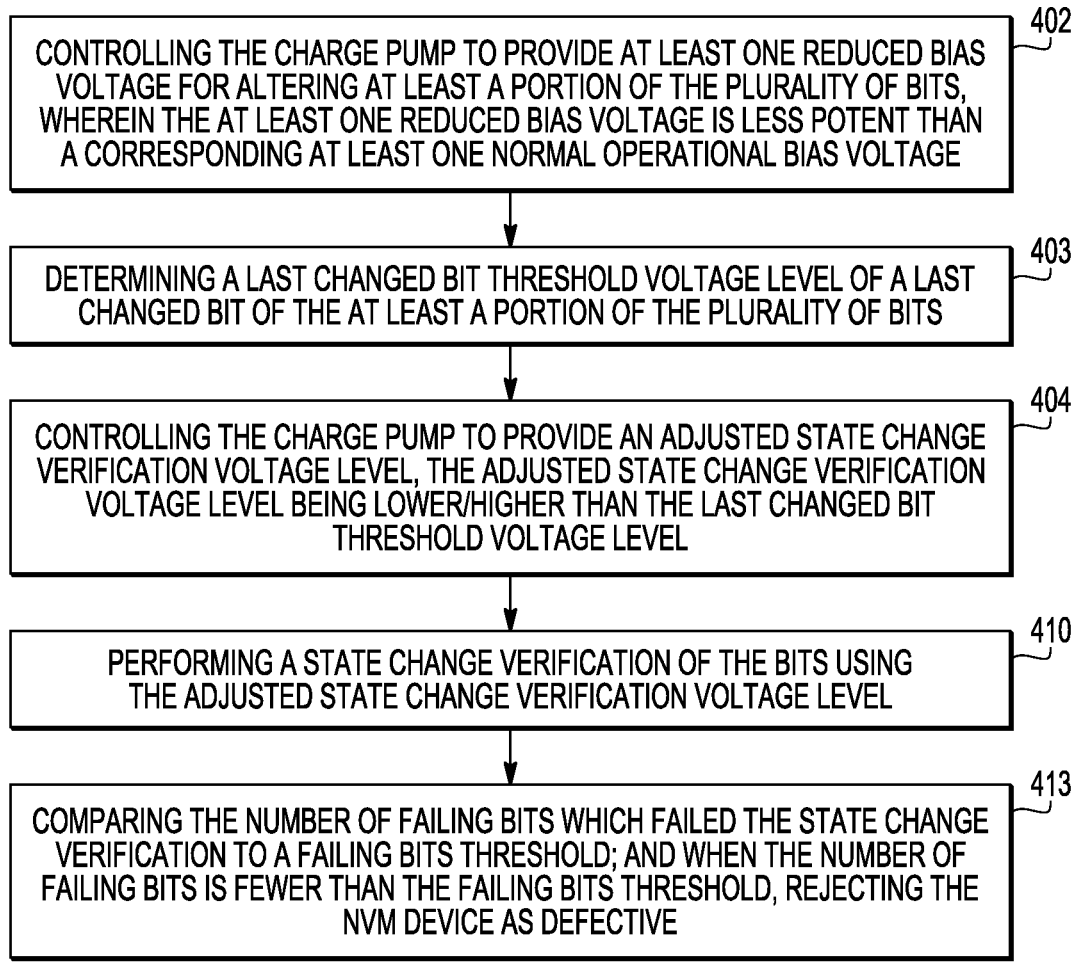
FIG. 4 is a flow diagram illustrating a method in accordance with at least one embodiment.

FIG. 4 is a flow diagram illustrating a method 401 in accordance with at least one embodiment. In block 402, a charge pump is controlled to provide at least one reduced bias voltage for altering at least a portion of the plurality of bits, wherein the at least one reduced bias voltage level is less potent than a corresponding at least one normal bias voltage. It is noted that, for normal altering of at least a portion of the plurality of bits (e.g., erasing the at least the portion of the plurality of bits, programming the at least the portion of the plurality of bits), a normal bias voltage and a normal state change verification voltage are used. From block 402, the method continues to block 403.

In block 403, the threshold voltage (Vt) level of the last changed bit of the at least a portion of the plurality of bits is determined. As an example, state change verification or user margin read operations may be performed by starting at a high read gate voltage and iteratively reducing the read gate voltage of each memory cell of the NVM block until a first bit of one of the memory cells of the NVM block changes state. Accordingly, the threshold voltage (Vt) level of the last changed bit may be determined to a desired level of resolution. From block 403, the method continues to block 404. In block 404, the charge pump is controlled to provide an adjusted state change verification voltage level, the adjusted state change verification voltage level being lower/higher than the last changed bit threshold voltage level. As an example, the adjusted state change verification voltage level may be selected to impose a more stringent threshold for determining a state of a bit of the plurality of bits. As used herein, "more stringent" should be understood to mean a threshold farther from an opposite storage state of a bit. As an example, when an adjusted erase verification voltage (as one example of an adjusted state change verification voltage level) imposes a more stringent threshold voltage for verifying erasure of a bit (as one example of verifying an altered storage state of a bit) than a LEB threshold voltage level (as one example of a last changed bit threshold voltage level), the adjusted erase verification voltage imposes a threshold voltage for verifying erasure of the bit that is farther from a threshold voltage of a program storage state of the bit than how far the LEB threshold voltage level is from the threshold voltage of the program storage state of the bit. Accordingly, an undererased bit (i.e., undererased relative to a more stringent erase verify threshold voltage) would fail an erase verify operation using that more stringent erase verify threshold voltage, while a properly erased or overerased bit (i.e., properly erased or overerased relative to that more stringent erase verify threshold voltage) would pass an erase verify operation using that more stringent erase verify threshold voltage. As another example, when an adjusted program verification voltage (as another example of an adjusted state change verification voltage level) imposes a more stringent threshold voltage for verifying programming of a bit (as another example of verifying an altered storage state of a bit) than a last programmed bit threshold voltage level (as another example of a last changed bit threshold voltage level), the adjusted program verification voltage imposes a threshold voltage for verifying programming of the bit that is farther from a threshold voltage of an erase storage state of the bit than how far the last programmed bit threshold voltage level is from the threshold voltage of the erase storage state of the bit. Accordingly, an underprogrammed bit (i.e., underprogrammed relative to a more stringent program verify threshold voltage) would fail a program verify operation using that more stringent program verify threshold voltage, while a properly programmed or overprogrammed bit (i.e., properly programmed or overprogrammed relative to that more stringent program verify threshold voltage) would pass a program verify operation using that more stringent program verify threshold voltage. As an example, in the case of erased bits, the adjusted state change verification voltage level may be selected to impose a threshold lower than the last changed bit (e.g., last erased bit) threshold voltage level. As another example, in the case of programmed bits, the adjusted state change verification voltage level may be selected to impose a threshold higher than the last changed bit (e.g., last programmed bit) threshold voltage level. From block 404, the method continues to block 410.

In block 410, a state change verification of the bits is performed using the adjusted state change verification voltage level. From block 410, the method continues to block 413. In block 413, the number of failing bits which failed the adjusted state change verification is compared to a failing bits threshold. When the number of failing bits is fewer than the failing bits threshold, the device comprising the NVM block is rejected as defective. The at least some of the foregoing operations may be performed repetitively to enable rejecting the device comprising the NVM block when the number of failing bits is only infrequently fewer than the failing bits threshold.

In accordance with at least one embodiment, in block 402, the charge pump is controlled to provide at least one reduced bias voltage for changing a state of at least a portion of the plurality of bits. For example, the charge pump can be controlled to provide at least one reduced bias voltage for erasing/programming at least a portion of the plurality of bits to an erased/programmed state.

In accordance with at least one embodiment, in block 404, the NVM controller controls the charge pump to provide the adjusted erase verification voltage level, for example, wherein the erase verification voltage level is a predetermined amount, in range from 100 to 700 millivolts, lower than the last changed bit (i.e., the least erased bit) threshold voltage level. With respect to a program operation, the NVM controller controls the charge pump to provide the adjusted program verification voltage level, wherein the program verification voltage level is a predetermined amount, in range from 100 to 700 millivolts, higher than the last changed bit (i.e., the least programmed bit) threshold voltage level. In accordance with at least one embodiment, in block 404, the NVM controller controls the charge pump to provide the state change verification voltage level, wherein the state change verification voltage level is at least 200 millivolts but not more than 500 millivolts different from the last changed bit threshold voltage level.

In accordance with at least one embodiment, in block 410, an erasure/program verification of the bits is performed using the adjusted state change verification voltage level.

Figure 5:
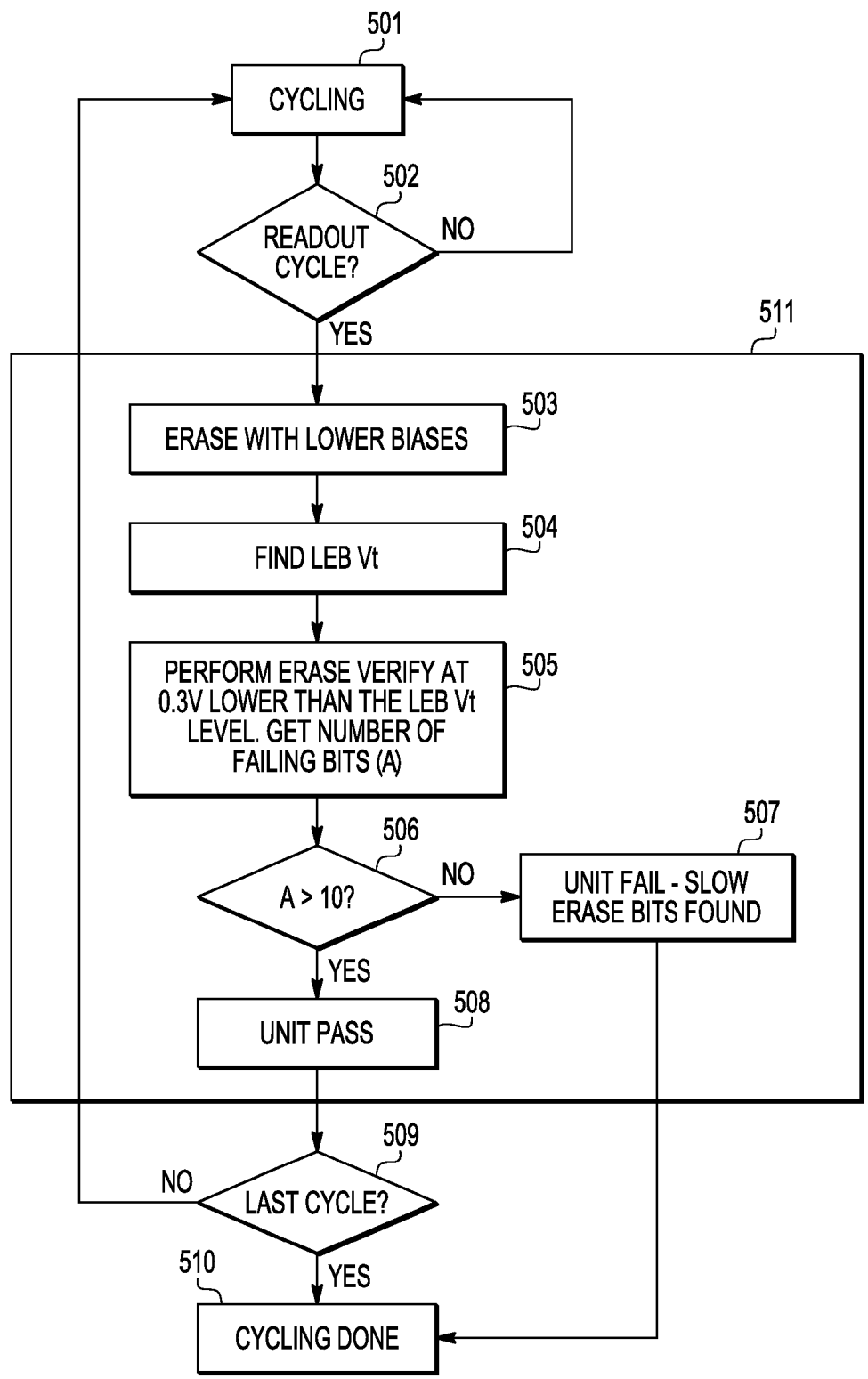
FIG. 5 is a flow diagram illustrating a method in accordance with at least one embodiment.

FIG. 5 is a flow diagram illustrating a method in accordance with at least one embodiment. In block 501, a program and erase cycling process is performed. Such program and erase cycling is typically done in production burn-in (BI) test flow and can include one or more program and erase cycles. From block 501, the method continues to decision block 502. In decision block 502, a decision is made as to whether or not a readout cycle (e.g., every 10th or 50th cycle at which the program/erase performance is read and saved) is being performed. As an example, for some iterations of the program and erase cycling process of block 501, a readout cycle may be performed, while for other iterations of the program and erase cycling process of block 501, a readout cycle may not be performed. For non-readout cycles, the program/erase cycles 501 are not evaluated. A readout cycle allows verification of the response of the NVM bit cells to the program and erase cycling by reading out the bits of those bit cells and comparing them to the values they are expected to have as a result of the current state of the program and erase cycling and also read and save the program/erase performance like program/erase times and pulse counts. By incorporating a technique disclosed herein, a readout cycle may be used to identify latent slow-to-erase bits. As an example, for non-readout cycles, normal erase bias levels and normal program bias levels may be used, while, for at least some readout cycles, reduced erase bias levels or reduced program bias levels may be used. Reduced erase bias levels or reduced program bias levels need not be used for all readout cycles. For example, normal erase bias levels and normal program bias levels may be used for some readout cycles, although FIG. 5 assumes reduced erase bias levels or reduced program bias levels will be used for all readout cycles for simplicity of illustration.

If the decision in decision block 502 is that a readout cycle is not being performed, the method returns to block 501 to continue cycling. If decision in decision block 502 is that a readout cycle is being performed, the method continues to slow-to-erase bit testing 511 and, specifically, to block 503. Slow-to-erase bit testing 511 comprises blocks 503, 504, 505, 506, 507, and 508. In block 503, erasure is performed using a reduced erase bias. From block 503, the method continues to block 504. In block 504, the threshold voltage (Vt) of the least erased bit (LEB) is found. From block 504, the method continues to block 505. In block 505, an erase verify is performed at an adjusted erase verify level, for example, 0.3 volts lower than the LEB Vt, and the number of failing bits failing the erase verify (i.e., the number of bits with Vt above the adjusted erase verify level) is obtained. From block 505, the method continues to decision block 506. In decision block 506, a decision is made as to whether or not the number of failing bits is greater than a relatively small number, for example, ten. If not, the relatively low number of failing bits is considered indicative of the LEB (and a few more bits) being outside of an expected distribution of bits, and, in block 507, the unit is deemed to have failed the slow-to-erase bit testing 511, with the method continuing to block 510, where the burn-in (BI) cycling is completed. If so, the relatively high number of failing bits is considered indicative of the LEB being within the expected distribution of bits, and, in block 508, the unit is deemed to have passed the slow-to-erase bit testing 511, with the method continuing to decision block 509. In decision block 509, a decision is made as to whether or not the last cycle of the cycling has been performed. If not, the method returns to block 501, where the cycling continues. If so, the method continues to block 510, where the cycling is completed with a pass.

Figure 6:
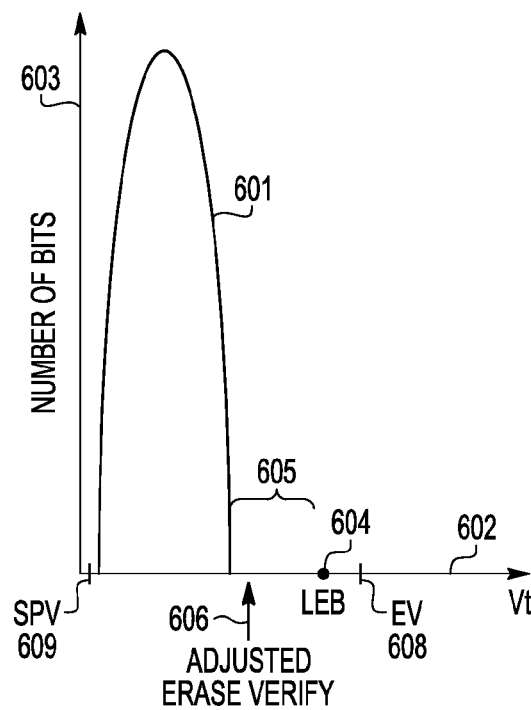
FIG. 6 is a graph illustrating the threshold voltage (Vt) distribution of an NVM block after the erase operation at step 503, which would fail the slow-to-erase bit test, having a main Vt distribution of erased bits 601 and a latent most reluctantly changed bit 604 outside of the expected distribution 601 showing an adjusted erase verify level 606 in accordance with at least one embodiment.
Figure 7:
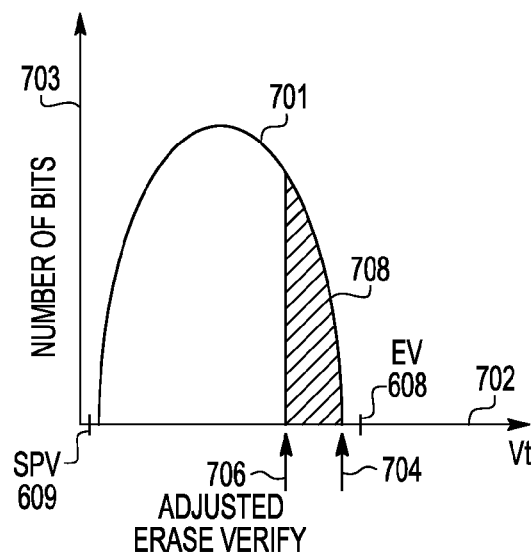
FIG. 7 is a graph illustrating the threshold voltage (Vt) distribution of an NVM block after the erase operation at step 503, which would pass the slow-to-erase bit test, having a main distribution 701 of erased bits in accordance with at least one embodiment.

FIG. 6 is a graph illustrating the threshold voltage (Vt) distribution of an NVM block after the erase operation at step 503, which would fail the slow-to-erase bit test. The Vt distribution is plotted with a linear horizontal axis 602 representing bit cell threshold voltage for individual bits of a plurality of bits and a logarithmic vertical axis 603 representing the number of individual bits having a particular threshold voltage (Vt). The Vt distribution in FIG. 6 has a main Vt distribution of erased bits 601, and a latent most reluctantly changed bit 604 (e.g., the least erased bit (LEB)) outside of the main distribution 601. A latent most reluctantly changed bit may include, for a population of erased bits, a latent slow-to-erase bit and, or for a population of programmed bits, a latent slow-to-program bit. A normal erase verify level (EV) 608 and a soft program verify level (SPV) 609 are illustrated in accordance with at least one embodiment. After an erase operation (including soft program step) passes, all the bits in the NVM block being erased will have threshold voltage below the normal erase verify level and above the soft program verify level. Note that the normal erase verify level is the same for all the cycles and all the devices of the particular type being tested, while the LEB Vt may vary from device to device and even vary from cycle to cycle on the same device. An adjusted erase verify level 606 is illustrated in accordance with at least one embodiment. The adjusted erase verify level 606 is a predetermined amount, e.g., 300 millivolts, lower than the LEB Vt. The presence of more than a relatively small number of bits above the reduced erase verify level 606 can be considered indicative of the most reluctantly changed bit 604 being included within main distribution 601, while the absence of more than a relatively small number of bits above the adjusted erase verify level 606 (as shown in FIG. 7) can be considered indicative of the most reluctantly changed bit 604 being excluded from, and lying outside of, the main distribution 601. As illustrated, the most reluctantly changed bit 604 (e.g., the LEB) is lying outside of the main distribution 601, separated by at least a difference 605 of Vt from the Vt values for the bits within the main distribution 601.

It has been noticed that latent slow-to-erase bit 604 tends to be exponentially slower to erase than other bits and hence be much more easily separated from main distribution when erasure is performed with lower bias. Thus, through the use an erase cycle using a lower erase bias, the existence of a latent slow-to-erase bit can become after a limited number of program/erase cycles, especially when combined with the use of an adjusted erase verification voltage of approximately 300 millivolts below the Vt of the LEB 604. Thus, the LEB 604 is a single outlier, lying outside of the main Vt distribution 601. While only a single slow-to-erase bit 604 is shown in FIG. 6, it should be understood that more than one such bit could be present and still be considered to be an outlier.

FIG. 7 is a graph illustrating the Vt distribution of an NVM block after the erase operation at step 503, which would pass the slow-to-erase bit test, having only a main distribution 701 of erased bits. The distribution 701 is plotted with respect to a linear horizontal axis 702 and a logarithmic vertical axis 703. The normal erase verify level (EV) 608 and soft program verify level (SPV) 609 shown in FIG. 7 are the same as those in FIG. 6. The threshold voltage of the least-erased bit (LEB) 704 and the adjusted erase verify level 706, which is a predetermined amount, e.g. 300 millivolts, lower than the LEB Vt are shown. As indicated as the shaded area 708, the number of bits with Vt above the adjusted erase verify level 706 will be substantial as the adjusted erase verify level will cut into the main distribution of the bits.

Comparing the main Vt distribution 601 in FIG. 6 vs. the main Vt distribution 701 in FIG. 7, the main Vt distribution 601 is shifted to the left toward the lower Vt and is more compacted. The reason is due to the majority of the bits in FIG. 6 being tested have been exposed to erase conditions for a longer period of time, e.g., exposure to additional erase pulses, which is needed to sufficiently erase the slow-to-erase bit (which is also the LEB) 604 in FIG. 6, e.g., change its Vt to be less than the normal erase verify level. Therefore, faster to erase NVM bits can become over-erased, i.e., having threshold voltage below the soft program verify level, which are then soft programmed to above the soft program verify level to overcome the problems associated with over-erase like excessive column current leakage. Note that soft programming typically takes a relatively long time since it is done per address and with a low program bias. As more cells are required to be soft programmed, the increasing duration of soft programming may eventually cause the embedded erase operation to fail to complete within the specified maximum time. Thus we the described slow-to-erase bit test can be used to screen out any unit with latent slow-to-erase bit as early as possible.

At least one embodiment of the present disclosure may be implemented for a floating gate memory block. As an example, at least one embodiment may be implemented for a non-volatile floating gate memory block. Examples of types of memory blocks for which at least one embodiment may be implemented include flash memory blocks, traditional electrically erasable programmable read-only memory (EEPROM) blocks, ferroelectric random access memory (FeRAM), magnetoresistive random access memory (MRAM), programmable metallization cell (PMC) memory, and phase change memory (PCM). While a reduced voltage may be used with some memory technologies to detect a latent slow erase bit, a reduced current, a reduced pulse width, and/or a reduced number of pulses may be used with the same or other memory technologies to detect a latent slow erase bit.

Embodiments may be practiced with various memory technologies. For example, embodiments may be practiced with NOR flash memory and/or with NAND flash memory. Embodiments may be practiced with one-bit-per-cell (i.e., single-level cell (SLC)) and multiple-bit-per-cell (multiple-level cell (MLC)) memory technologies. Embodiments may be practiced with conductive (e.g., polysilicon) and/or non-conductive (e.g., silicon nitride ($Si_3N_4$) and/or metal nanocrystal) floating gate technologies. Embodiments may be practiced with memory blocks using hot carrier injection and/or a quantum tunneling erasure mechanism.

With at least some embodiments, the erasure and programming of bits can be characterized as a statistical distribution where the majority of bits lie within a few standard deviations of a mean value representative of a difficulty of changing the state of the bit either by erasing the bit from a programmed state to an erased state or by programming the bit from an erased to a programmed state. The statistical distribution may be roughly a Gaussian distribution. For example, the distribution may be a truncated Gaussian distribution, or "compacted" Gaussian distribution (i.e., an expected distribution), where the range over which the bits may lie is limited. However, a latent slow-to-erase bit may lie outside of the range of the distribution that contains the majority of bits.

To identify a latent slow-to-erase bit, an adjusted erase verify level may be used that is a predetermined amount lower than a threshold voltage of the least erased bit (LEB). If many bits fail the erase verify using the adjusted erase verify level, the LEB is considered to fall within the expected distribution of bits and not to be an outlier. Thus, no bits are considered to be faulty, and the part does not fail the latent slow-to-erase bit testing stage. However, if only one or a few bits fail the erase verify using the adjusted erase verify level, the LEB (together with the few bits if more than one bit fail) is considered to fall outside the expected distribution of bits and to be an outlier. Thus, the one or few bits are considered to be faulty, and the part fails the latent slow-to-erase bit testing stage.

Various phenomena can result in a slow-to-erase situation affecting at least one bit. For example, a thicker oxide layer may make it more difficult to change the state of the at least one bit. If the variation of the difficulty in changing state of the bits is within the expected distribution, the part can be accepted as is. If the variation of the difficulty in changing state of at least one of the bits falls outside the expected distribution, the part can be considered to be defective. However, since the at least one of the bits that falls outside of the expected distribution can be identified, the at least one of the bits can, in at least some embodiments, be marked as bad and replaced by a spare bit, allowing the part to be salvaged and accepted. The extent to which the at least one of the bits lies outside of the expected distribution can be used for qualifying the part to one of several grades or bins. Such binning can be used to allow qualification of parts for less stringent applications that may not have bit erasure or bit programming characteristics uniform enough for more stringent applications.

In accordance with at least one embodiment, some NVMs are passing testing but should, in fact, fail because of a latent slow-to-erase bit or bits. By using adjusted testing levels and determining if the least erased bit (LEB) is part of an expected distribution (e.g., a Gaussian distribution or a truncated or "compacted" Gaussian distribution), cycling of such testing can accurately determine whether the part should pass the testing or be rejected as defective. At least one embodiment may be applied to memory, non-volatile memory (NVM), flash memory, latent slow erase bit detection, zero defect designs and processes, NVM designs, NVM processes, and/or NVM testing.

In accordance with at least one embodiment, a method comprises changing a bit state of a plurality of bits using reduced biases with a normal state change verification level; finding the most reluctantly changed bit threshold voltage level; performing an adjusted state change verification at a predetermined state change verification level that is a prescribed amount less potent than the most reluctantly changed bit threshold voltage level; and screening out the unit if the adjusted state change verification reveals one or more bits are outside an expected distribution of bits. Such a method may be performed in accordance with operation of an NVM controller of an NVM. At least one embodiment allows latent most reluctantly changed bit testing to be performed after production testing, for example, by using a user margin read mode extended by making a failing bit count accessible in a user test mode.

In accordance with at least one embodiment, a method for detecting a latent slow erase bit in a non-volatile memory (NVM) comprises erasing a plurality of the NVM cells of the NVM; determining a least erased bit (LEB) threshold voltage level of a least erased bit (LEB) of the plurality of the NVM cells of the NVM; performing an erase verify of the NVM at a reduced erase verify read threshold voltage level, the reduced erase verify read threshold voltage level being a predetermined amount lower than the LEB read threshold voltage level; determining a number of failing bits, wherein failing bits are bits failing the erase verify, and rejecting the NVM in response to the number of failing bits being less than a failing bits threshold. In accordance with at least one embodiment, the erasing the plurality of the NVM cells comprises erasing the plurality of the NVM cells with a reduced erase bias and a normal erase verify level, wherein the method further comprises erasing the plurality of NVM cells of the NVM with a normal erase bias and the normal erase verify level, the reduced erase bias having a reduced level relative to the normal erase bias. In accordance with at least one embodiment, the erasing the plurality of the NVM cells with the reduced erase bias comprises erasing the at least the portion of the NVM with a reduced substrate voltage. In accordance with at least one embodiment, the erasing the plurality of the NVM cells with the reduced erase bias comprises erasing the at least the portion of the NVM with a reduced gate voltage.

In accordance with at least one embodiment, the performing the erase verify at the reduced erase verify read threshold level is performed with the reduced erase verify read threshold level being at least 100 millivolts lower than the LEB read threshold voltage level. In accordance with at least one embodiment, the performing the erase verify at the reduced erase verify read threshold level is performed with the reduced erase verify read threshold level being at least 200 millivolts but not more than 700 millivolts lower than the LEB read threshold voltage level. In accordance with at least one embodiment, the performing the erase verify at the reduced erase verify read threshold level comprises adjusting a charge pump to obtain a lower voltage in burn-in cycling to detect intermittent slow erase bits.

In accordance with at least one embodiment, a method for detecting a latent slow bit in a non-volatile memory (NVM) comprises performing program/erase cycling of the NVM in production test flow; performing the method of claim 1 at each readout cycle during the cycling. In accordance with at least one embodiment, erasing during a non-readout program/erase cycle of the program/erase cycling is performed using a normal erase bias and a normal erase verify read threshold voltage level.

In accordance with at least one embodiment, a method for detecting a latent slow bit in a non-volatile memory (NVM) comprises altering a storage state of the plurality of bits of the NVM; determining a last changed bit threshold voltage level of a last changed bit of the plurality of bits, wherein the last changed bit of the plurality of bits is a bits whose storage state is changed last by the altering the storage state of the plurality of bits; performing a state change verification of the bits using an adjusted state change verification voltage level, the adjusted state change verification voltage level imposing a more stringent threshold voltage for verifying an altered storage state of a bit of the plurality of bits than the last changed bit threshold voltage level, comparing a number of failing bits which failed the state change verification to a failing bits threshold, and rejecting a device comprising the NVM in response to the number of failing bits being fewer than the failing bits threshold. In accordance with at least one embodiment, the altering the storage state of the plurality of bits of the NVM comprises altering the storage state of the plurality of bits of the NVM using a reduced bias voltage level and a normal state change verification voltage level, wherein the method further comprises altering the storage state of the plurality of bits of the NVM using a normal bias voltage level and the normal state change verification voltage level, wherein the reduced bias voltage level is less potent than the normal bias voltage level.

In accordance with at least one embodiment, for erased bits, the adjusted state change verification voltage level imposes a threshold voltage lower than the last changed bit threshold voltage level. In accordance with at least one embodiment, the adjusted state change verification voltage level is a predetermined amount, at least 100 millivolts, lower than the last changed bit threshold voltage level. In accordance with at least one embodiment, for programmed bits, the adjusted state change verification voltage level imposes a threshold voltage higher than the last changed bit threshold voltage level. In accordance with at least one embodiment, the adjusted state change verification voltage level is a predetermined amount, at least 100 millivolts, higher than the last changed bit threshold voltage level.

In accordance with at least one embodiment, a non-volatile memory (NVM) comprises a bitcell array comprising a plurality of bitcells for storing a plurality of bits; a charge pump coupled to the plurality of bitcells; and an NVM controller coupled to the bitcell array and to the charge pump, the NVM controller comprising control logic to control the charge pump to provide a normal bias voltage for altering the plurality of bits, to control the charge pump to provide at least one reduced bias voltage for altering the plurality of bits, wherein the at least one reduced bias voltage is less potent than the normal bias voltage, to determine a last changed bit threshold voltage level of a last changed bit of the plurality of bits, to control the charge pump to provide an adjusted state change verification voltage level, the adjusted state change verification voltage level selected from a group consisting of an erase verify voltage level, the erase verify voltage level being lower than a least erased bit threshold voltage level, and a program verify voltage level, the program verify voltage level being higher than a least programmed bit threshold voltage level, to perform a state change verification of the bits using the adjusted state change verification voltage level, to compare a number of failing bits which failed the state change verification to a failing bits threshold, and, when the number of failing bits is fewer than the failing bits threshold, to reject the NVM as defective.

In accordance with at least one embodiment, the control logic to control the charge pump to provide at least one reduced bias voltage for altering the plurality of bits further comprises control logic to control the charge pump to provide at least one reduced bias voltage for erasing the plurality of bits; and the control logic to perform the state change verification of the bits using the adjusted state change verification voltage level further comprises control logic to perform an erase verify of the bits using the adjusted erase verification voltage level. In accordance with at least one embodiment, the control logic to control the charge pump to provide at least one reduced bias voltage for altering the plurality of bits further comprises control logic to control the charge pump to provide at least one reduced bias voltage for programming the plurality of bits; and the control logic to perform the state change verification of the bits using the adjusted state change verification voltage level further comprises control logic to perform a programming verification of the bits using the adjusted program verification voltage level. In accordance with at least one embodiment, the NVM controller controls the charge pump to provide the adjusted state change verification voltage level, wherein the adjusted state change verification voltage level is a predetermined amount more stringent than the last changed bit threshold voltage level. In accordance with at least one embodiment, the NVM controller implements a user margin read mode with fail bit count accessible via a user mode instruction.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Some of the above embodiments, as applicable, may be implemented using a variety of different information processing systems.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method for detecting a latent slow erase bit in a non-volatile memory (NVM) comprising:
   erasing a plurality of the NVM cells of the NVM;
   determining a least erased bit (LEB) threshold voltage level of a least erased bit (LEB) of the plurality of the NVM cells of the NVM;
   performing an erase verify of the NVM at a reduced erase verify read threshold voltage level, the reduced erase verify read threshold voltage level being a predetermined amount lower than the LEB read threshold voltage level;
   determining a number of failing bits, wherein failing bits are bits failing the erase verify; and
   rejecting the NVM in response to the number of failing bits being less than a failing bits threshold.

2. The method of claim 1 wherein the erasing the plurality of the NVM cells comprises:
   erasing the plurality of the NVM cells with a reduced erase bias and a normal erase verify level, wherein the method further comprises:
      erasing the plurality of NVM cells of the NVM with a normal erase bias and the normal erase verify level, the reduced erase bias having a reduced level relative to the normal erase bias.

3. The method of claim 2 wherein the erasing the plurality of the NVM cells with the reduced erase bias comprises:
   erasing the at least the portion of the NVM with a reduced substrate voltage.

4. The method of claim 2 wherein the erasing the plurality of the NVM cells with the reduced erase bias comprises:
   erasing the at least the portion of the NVM with a reduced gate voltage.

5. The method of claim 1 wherein the performing the erase verify at the reduced erase verify read threshold level is performed with the reduced erase verify read threshold level being at least 100 millivolts lower than the LEB read threshold voltage level.

6. The method of claim 1 wherein the performing the erase verify at the reduced erase verify read threshold level is performed with the reduced erase verify read threshold level being at least 200 millivolts but not more than 700 millivolts lower than the LEB read threshold voltage level.

7. The method of claim 1 wherein the performing the erase verify at the reduced erase verify read threshold level comprises:
   adjusting a charge pump to obtain a lower voltage in burn-in cycling to detect intermittent slow erase bits.

8. A method for detecting a latent slow bit in a non-volatile memory (NVM) comprising:
   performing program/erase cycling of the NVM in production test flow;
   performing the method of claim 1 at each readout cycle during the cycling.

9. The method of claim 8 wherein erasing during a non-readout program/erase cycle of the program/erase cycling is performed using a normal erase bias and a normal erase verify read threshold voltage level.

10. A method for detecting a latent slow bit in a non-volatile memory (NVM) comprising:
    altering a storage state of the plurality of bits of the NVM;
    determining a last changed bit threshold voltage level of a last changed bit of the plurality of bits, wherein the last changed bit of the plurality of bits is a bits whose storage state is changed last by the altering the storage state of the plurality of bits;
    performing a state change verification of the bits using an adjusted state change verification voltage level, the adjusted state change verification voltage level imposing a more stringent threshold voltage for verifying an altered storage state of a bit of the plurality of bits than the last changed bit threshold voltage level;
    comparing a number of failing bits which failed the state change verification to a failing bits threshold; and
    rejecting a device comprising the NVM in response to the number of failing bits being fewer than the failing bits threshold.

11. The method of claim 10 wherein the altering the storage state of the plurality of bits of the NVM comprises:
    altering the storage state of the plurality of bits of the NVM using a reduced bias voltage level and a normal state change verification voltage level, wherein the method further comprises:
       altering the storage state of the plurality of bits of the NVM using a normal bias voltage level and the normal state change verification voltage level, wherein the reduced bias voltage level is less potent than the normal bias voltage level.

12. The method of claim 10 wherein, for erased bits, the adjusted state change verification voltage level imposes a threshold voltage lower than the last changed bit threshold voltage level.

13. The method of claim 12 wherein the adjusted state change verification voltage level is a predetermined amount, at least 100 millivolts, lower than the last changed bit threshold voltage level.

14. The method of claim 10 wherein, for programmed bits, the adjusted state change verification voltage level imposes a threshold voltage higher than the last changed bit threshold voltage level.

15. The method of claim 14 wherein the adjusted state change verification voltage level is a predetermined amount, at least 100 millivolts, higher than the last changed bit threshold voltage level.

16. A non-volatile memory (NVM) comprising:
    a bitcell array comprising a plurality of bitcells for storing a plurality of bits;
    a charge pump coupled to the plurality of bitcells; and
    an NVM controller coupled to the bitcell array and to the charge pump, the NVM controller comprising control logic to control the charge pump to provide a normal bias voltage for altering the plurality of bits, to control the charge pump to provide at least one reduced bias voltage for altering the plurality of bits, wherein the at least one reduced bias voltage is less potent than the normal bias voltage, to determine a last changed bit threshold voltage level of a last changed bit of the plurality of bits, to control the charge pump to provide an adjusted state change verification voltage level, the adjusted state change verification voltage level selected from a group consisting of an erase verify voltage level, the erase verify voltage level being lower than a least erased bit threshold voltage level, and a program verify voltage level, the program verify voltage level being higher than a least programmed bit threshold voltage level, to perform a state change verification of the bits using the adjusted state change verification voltage level, to compare a number of failing bits which failed the state change verification to a failing bits threshold, and, when the number of failing bits is fewer than the failing bits threshold, to reject the NVM as defective.

17. The NVM of claim 16 wherein the control logic to control the charge pump to provide at least one reduced bias voltage for altering the plurality of bits further comprises:
control logic to control the charge pump to provide at least one reduced bias voltage for erasing the plurality of bits; and
the control logic to perform the state change verification of the bits using the adjusted state change verification voltage level further comprises:
control logic to perform an erase verify of the bits using the adjusted erase verification voltage level.

18. The NVM of claim 16 wherein the control logic to control the charge pump to provide at least one reduced bias voltage for altering the plurality of bits further comprises:
control logic to control the charge pump to provide at least one reduced bias voltage for programming the plurality of bits; and
the control logic to perform the state change verification of the bits using the adjusted state change verification voltage level further comprises:
control logic to perform a programming verification of the bits using the adjusted program verification voltage level.

19. The NVM of claim 16 wherein the NVM controller controls the charge pump to provide the adjusted state change verification voltage level, wherein the adjusted state change verification voltage level is a predetermined amount more stringent than the last changed bit threshold voltage level.

20. The NVM of claim 16 wherein the NVM controller implements a user margin read mode with fail bit count accessible via a user mode instruction.

* * * * *